(12) United States Patent
Kao et al.

(10) Patent No.: US 12,402,353 B2
(45) Date of Patent: Aug. 26, 2025

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Kuei-Yu Kao, Hsinchu (TW); Shih-Yao Lin, New Taipei (TW); Chen-Ping Chen, Toucheng Township (TW); Chih-Han Lin, Hsinchu (TW); Ming-Ching Chang, Hsinchu (TW); Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 616 days.

(21) Appl. No.: 17/824,379

(22) Filed: May 25, 2022

(65) Prior Publication Data

US 2023/0411478 A1    Dec. 21, 2023

(51) Int. Cl.
*H10D 30/67* (2025.01)
*H10D 62/10* (2025.01)
*H10D 64/01* (2025.01)
*H10D 64/27* (2025.01)

(52) U.S. Cl.
CPC ..... *H10D 30/6735* (2025.01); *H10D 30/6757* (2025.01); *H10D 62/121* (2025.01); *H10D 64/017* (2025.01); *H10D 64/018* (2025.01); *H10D 64/516* (2025.01)

(58) Field of Classification Search
CPC ........... H10D 30/6735; H10D 30/6757; H10D 62/121; H10D 64/017; H10D 64/018; H10D 64/516; H10D 30/797; H10D 30/014; H10D 30/43; H10D 62/151
See application file for complete search history.

(56) References Cited

U.S. PATENT DOCUMENTS

| | | | |
|---|---|---|---|
| 2018/0301531 A1* | 10/2018 | Xie | H10D 62/235 |
| 2019/0131431 A1* | 5/2019 | Cheng | H10D 30/024 |
| 2019/0148515 A1* | 5/2019 | Cheng | H10D 64/018 257/347 |
| 2020/0083352 A1* | 3/2020 | Chanemougame | H10D 30/6757 |

(Continued)

*Primary Examiner* — S M Sohel Imtiaz
(74) *Attorney, Agent, or Firm* — STUDEBAKER BRACKETT PLLC

(57) ABSTRACT

In a method of manufacturing a semiconductor device, a fin structure in which first semiconductor layers and second semiconductor layers are alternately stacked over a bottom fin structure protruding from a substrate, is formed. A sacrificial gate structure is formed over the fin structure. A source/drain region of the fin structure is etched, thereby forming a source/drain space. The first semiconductor layers are laterally etched through the source/drain space. An inner spacer is formed on an end of each of the etched first semiconductor layers. One or more epitaxial layers are formed in the source/drain space, and the sacrificial gate structure is replaced with a metal gate structure. A width of the source/drain space at a bottommost one of the first semiconductor layers is greater than a width of the source/drain space at one of the first semiconductor layers above the bottommost one of the first semiconductor layers.

20 Claims, 10 Drawing Sheets

(56) References Cited

U.S. PATENT DOCUMENTS

| | | | |
|---|---|---|---|
| 2020/0227534 A1* | 7/2020 | Chiang | H10D 30/6735 |
| 2020/0274000 A1* | 8/2020 | Xie | H10D 64/017 |
| 2021/0098627 A1* | 4/2021 | Liaw | H10D 30/0243 |

* cited by examiner

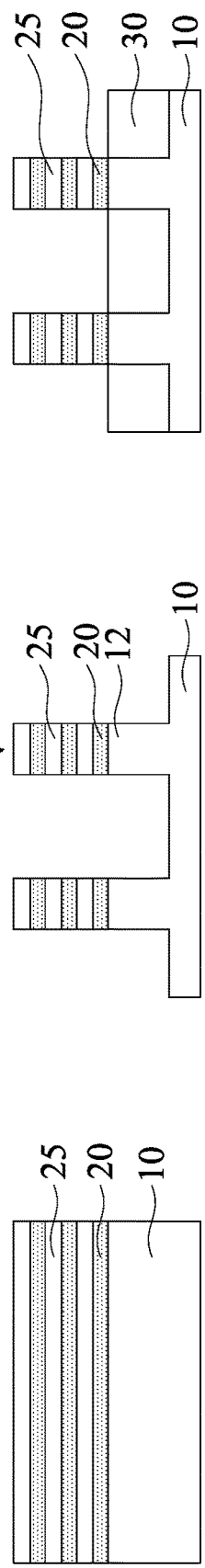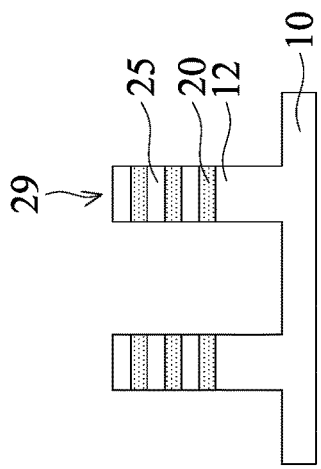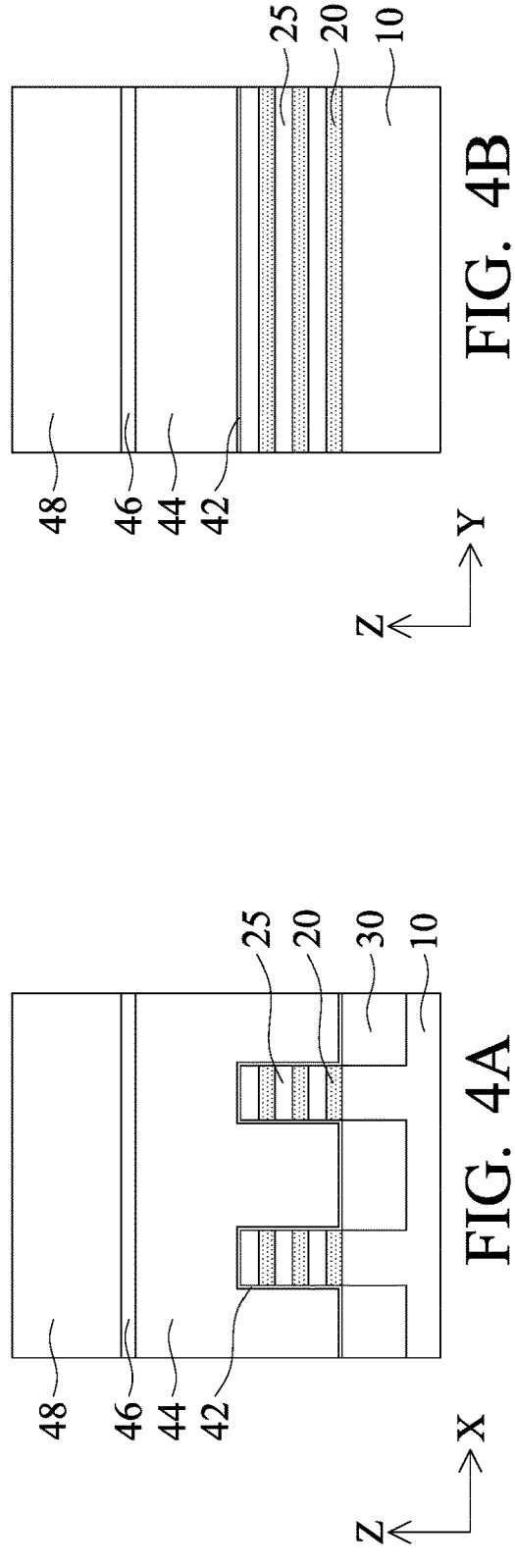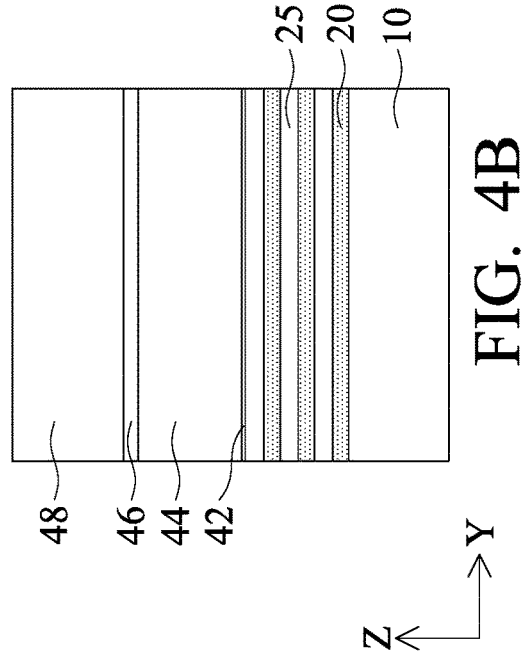

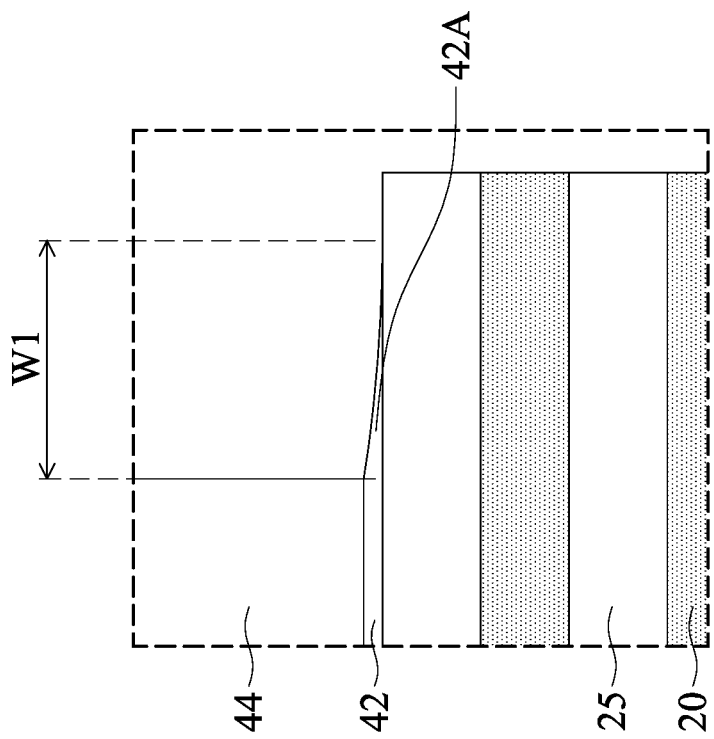
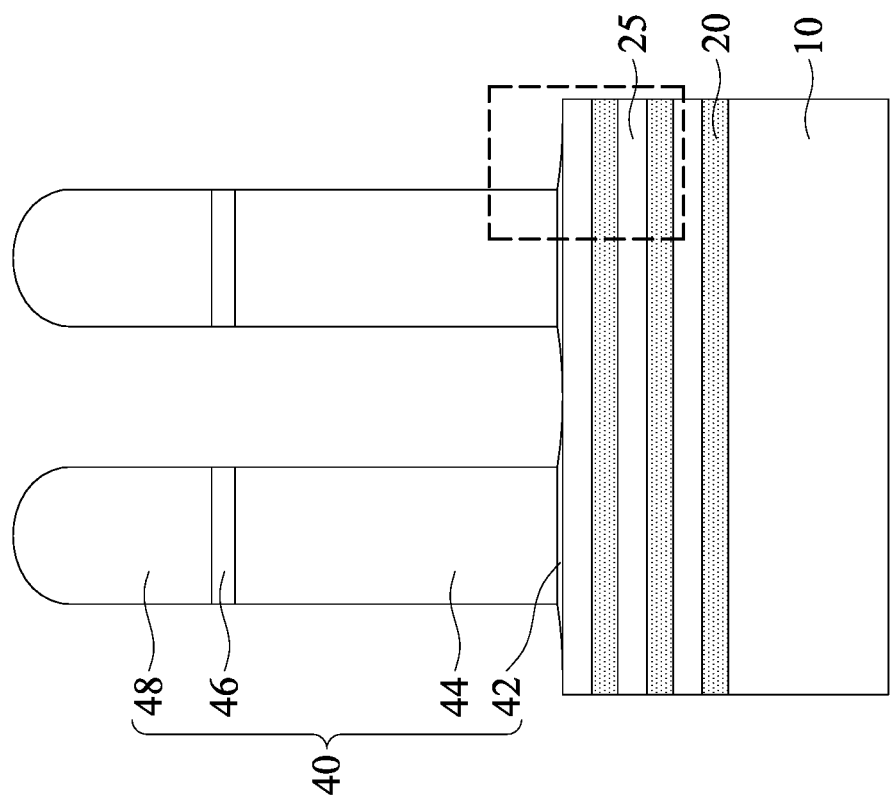
FIG. 7A
FIG. 7B

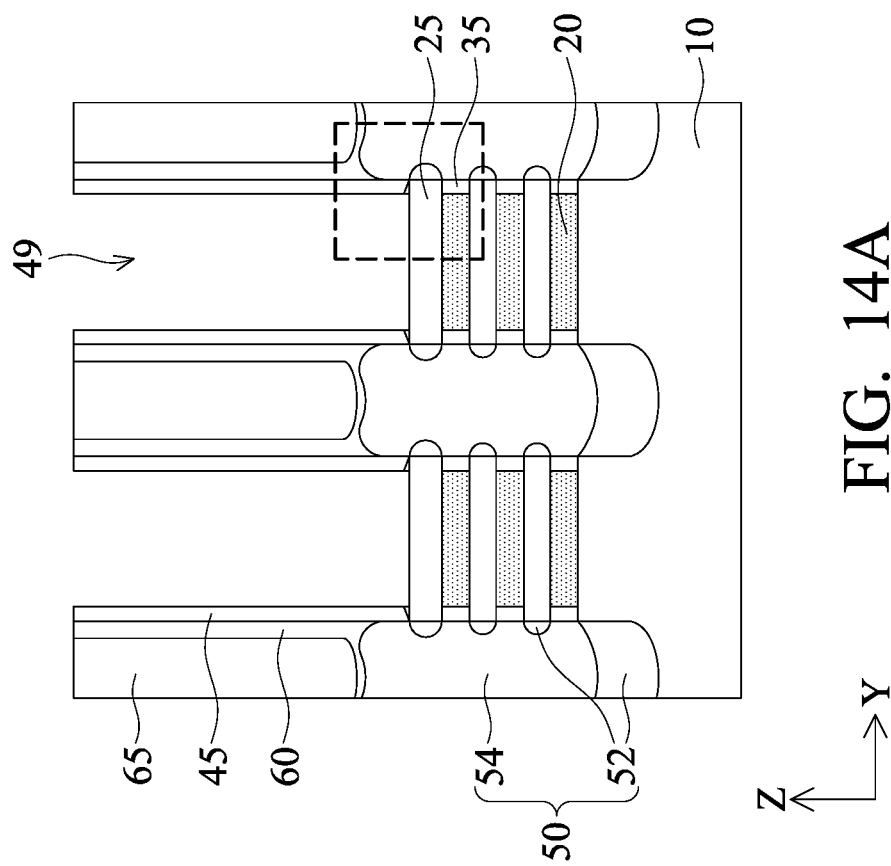
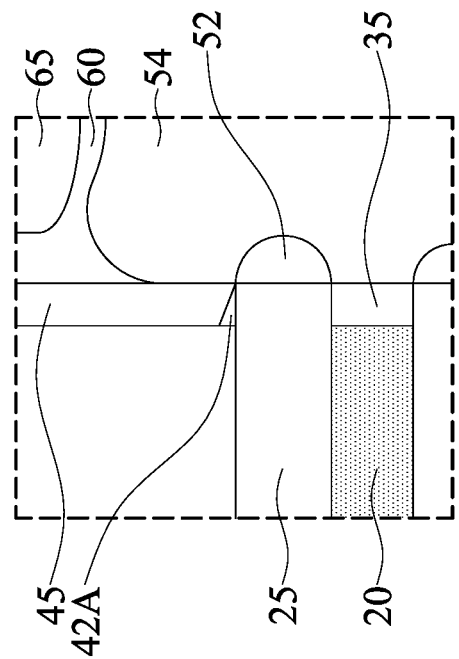
FIG. 14A
FIG. 14B

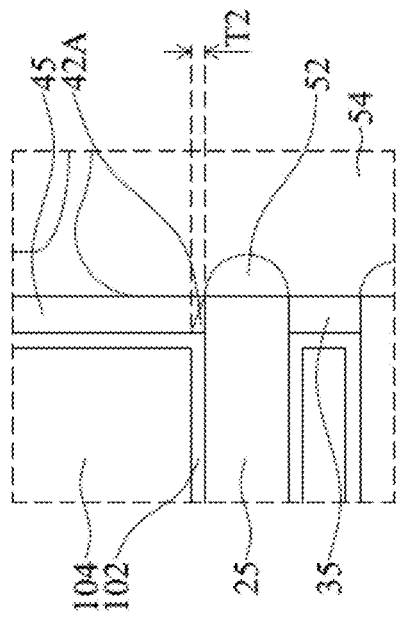
FIG. 16A
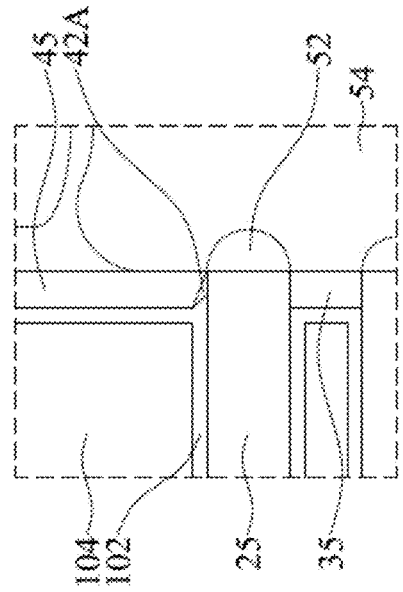
FIG. 16C
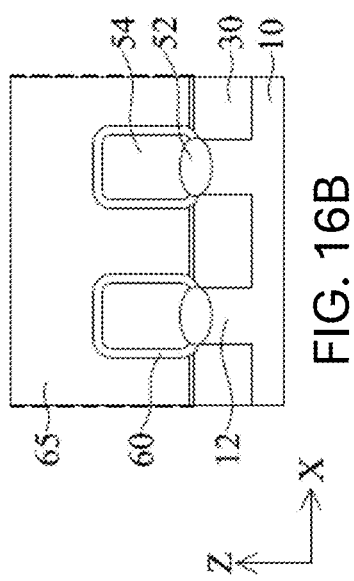
FIG. 16B
FIG. 16D

METHOD OF MANUFACTURING A SEMICONDUCTOR DEVICE AND A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows one of the various stages of manufacturing a semiconductor FET device according to an embodiment of the present disclosure.

FIG. 2 shows one of the various stages of manufacturing a semiconductor FET device according to an embodiment of the present disclosure.

FIG. 3 shows one of the various stages of manufacturing a semiconductor FET device according to an embodiment of the present disclosure.

FIGS. 4A and 4B show one of the various stages of manufacturing a semiconductor FET device according to an embodiment of the present disclosure.

FIGS. 7A and 7B show one of the various stages of manufacturing a semiconductor FET device according to an embodiment of the present disclosure.

FIGS. 14A and 14B show one of the various stages of manufacturing a semiconductor FET device according to an embodiment of the present disclosure.

FIGS. 16A, 16B, 16C and 16D show one of the various stages of manufacturing a semiconductor FET device according to an embodiment of the present disclosure.

DETAILED DESCRIPTION

Figure 6:
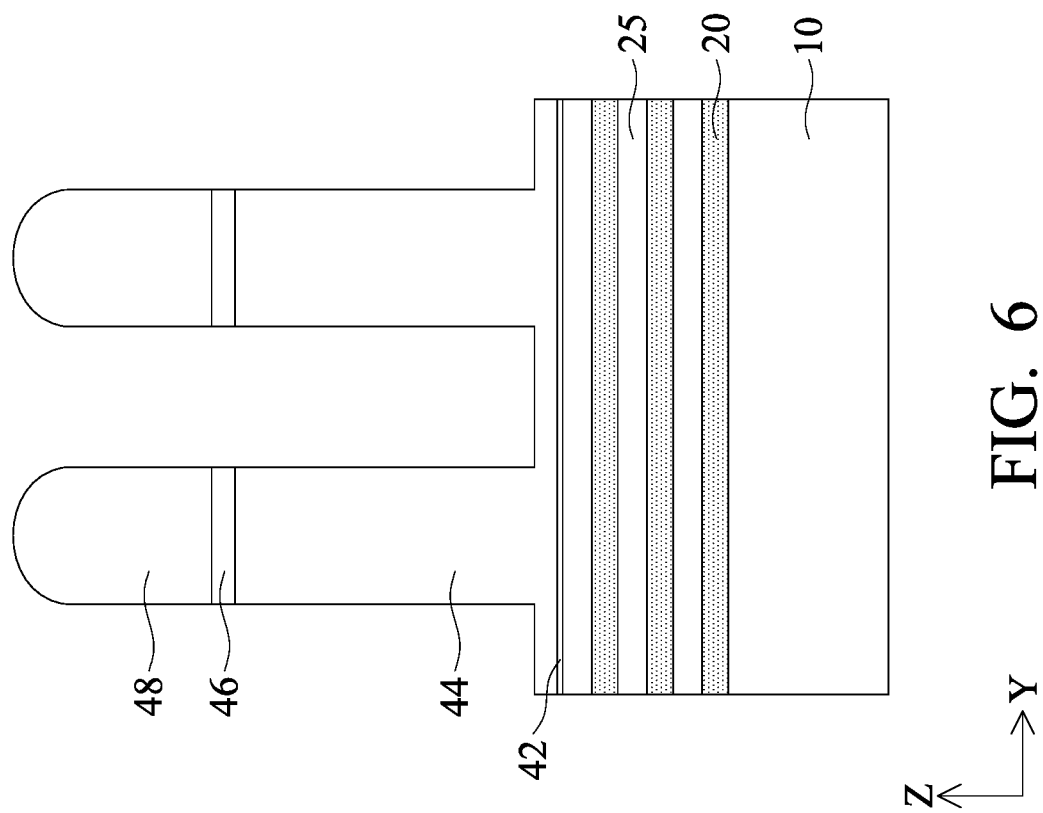
FIG. 6 shows one of the various stages of manufacturing a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Material, configuration, dimensions and/or processes explained with one embodiment may be employed in other embodiments, and detailed explanation thereof may be omitted. In this disclosure, a source/drain or a source/drain region refer to a source and/or a drain or a source region and/or a drain region. It is noted that in the present disclosure, a source and a drain are interchangeably used, and the structures thereof are substantially the same.

The present disclosure is generally related to a gate-all-around (GAA) FET, in particular, a GAA FET having vertically stacked multiple channels that are horizontally extending nanosheets or nanowires (nano structures).

FIGS. 1 to 16A-16D show various stages of manufacturing a semiconductor FET device according to an embodiment of the present disclosure. It is understood that additional operations can be provided before, during, and after processes shown by FIGS. 1-16D, and some of the operations described below can be replaced or eliminated, for additional embodiments of the method. The order of the operations/processes may be interchangeable.

As shown in FIG. 1, first semiconductor layers 20 and second semiconductor layers 25 are alternately formed over the substrate 10. In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments, the substrate 10 is, for example, a p-type silicon substrate with an impurity concentration in a range from about $1\times10^{15}$ atoms·cm$^{-3}$ to about $1\times10^{16}$ atoms·cm$^{-3}$. In other embodiments, the substrate is an n-type silicon or germanium substrate with an impurity concentration in a range from about $1\times10^{15}$ atoms·cm$^{-3}$ to about $1\times10^{16}$ atoms·cm$^{-3}$.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although three first semiconductor layers 20 and three second semiconductor layers 25 are shown in FIGS. 1-4B, the numbers are not limited to three, and can be 1, 2, or more than 3, and is less than 20. In some embodiments, the number of the first semiconductor layers 20 is greater by one than the number of the second semiconductor layers 25 (the top and bottom layers are the first semiconductor layer). In some embodiments, the first semiconductor layers 20 and/or the second semiconductor layers 25 are made of amorphous or polycrystalline semiconductor material.

In some embodiments, at least the second semiconductor layers 25, which are subsequently used as channel regions, are non-doped or doped with impurities in a smaller amount than the well regions. In some embodiments, the dopant concentration in the second semiconductor layer 25 is less than about $1\times10^{17}$ atoms·cm$^{-3}$.

After the stacked semiconductor layers are formed, fin structures 29 are formed by using one or more lithography and etching operations, as shown in FIG. 2. The fin structures 29 may be patterned by any suitable method. For example, the fin structures may be patterned using one or more photolithography processes such as EUV and DUV lithography, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 2, the fin structures 29 extend in the Y direction and are arranged in the X direction. The number of the fin structures 29 is not limited to two as shown in FIG. 2, and may be as small as one and three or more. In some embodiments, one or more dummy fin structures are formed on both sides of the fin structures 29 to improve pattern fidelity in the patterning operations. As shown in FIG. 2, the fin structures 29 have upper portions constituted by the stacked semiconductor layers 20, 25 and a bottom fin structure 12 (well region).

The width of the upper portion of the fin structure 29 along the X direction is in a range from about 5 nm to about 50 nm in some embodiments, and is in a range from about 10 nm to about 30 nm in other embodiments. In some embodiments, the fin structure 29 has a tapered shape having the top smaller in width than the bottom.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 12, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 30 so that the upper portions of the fin structures 29 are exposed. With this operation, the fin structures 29 are separated from each other by the isolation insulating layer 30, which is also called a shallow trench isolation (STI). The isolation insulating layer 30 may be made of suitable dielectric materials such as silicon oxide, silicon nitride, silicon oxynitride, fluorine-doped silicate glass (FSG), low-k dielectrics such as carbon doped oxides, extreme low-k dielectrics such as porous carbon doped silicon dioxide, a polymer such as polyimide, combinations of these, or the like. In some embodiments, the isolation insulating layer 30 is formed through a process such as CVD, flowable CVD (FCVD), or a spin-on-glass process, although any acceptable process may be utilized.

In some embodiments, the insulating material layer 30 is recessed until the upper portion of the bottom fin structure 12 is exposed. In other embodiments, the upper portion of the bottom fin structure 12 is not exposed. In some embodiments, the insulating material layer 30 is recessed to a level of the upper surface of the fin structure 12.

The first semiconductor layers 20 are sacrificial layers which are subsequently partially removed, and the second semiconductor layers 25 are subsequently formed into semiconductor wires or sheets as channel layers of an n-type GAA FET and/or a p-type GAA FET. In some embodiments, for a p-type GAA FET, the second semiconductor layers 25 are sacrificial layers which are subsequently partially removed, and the first semiconductor layers 20 are subsequently formed into semiconductor wires or sheets as channel layers.

After the isolation insulating layer 30 is formed, a sacrificial (dummy) gate structure 40 is formed as shown in FIGS. 7A and 7B. FIGS. 4A and 4B illustrate a structure after layers for the sacrificial gate structure 40 are formed over the exposed fin structures 29.

The sacrificial gate structure 40 is formed by first blanket depositing the sacrificial gate dielectric layer 42 over the fin structures 29, as shown in FIGS. 4A and 4B. In some embodiments, the sacrificial gate dielectric layer 42 is made of silicon oxide, aluminum oxide, hafnium oxide, or any other suitable material. The thickness of the sacrificial gate dielectric layer 42 is in a range from about 1 nm to about 10 nm in some embodiments and is in a range from about 2 nm to about 5 nm in other embodiments. A sacrificial gate electrode layer 44 is then blanket deposited on the sacrificial gate dielectric layer 42 and over the fin structures 29, such that the fin structures are fully embedded in the sacrificial gate electrode layer 44, as shown in FIGS. 4A and 4B. The sacrificial gate electrode layer 44 includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer including a first mask layer 46 and a second mask layer 48 is formed over the sacrificial gate electrode layer 44, as shown in FIGS. 4A and 4B. In some embodiments, the first layer 46 is a pad silicon nitride layer and the second layer 48 is a silicon oxide mask layer.

Figure 5:
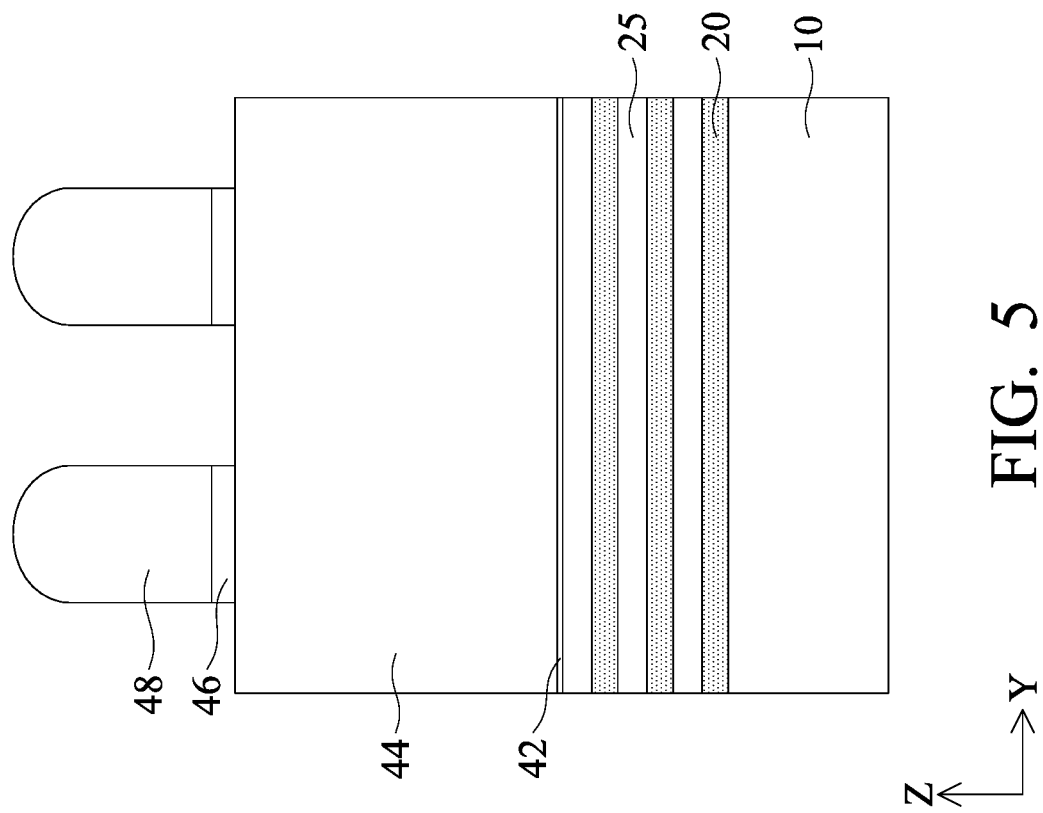
FIG. 5 shows one of the various stages of manufacturing a semiconductor FET device according to an embodiment of the present disclosure.

Next, a patterning operation is performed to form a hard mask pattern as shown in FIG. 5. Then, the sacrificial gate electrode layer 44 is patterned into the sacrificial gate structure 40, as shown in FIG. 6. The sacrificial gate structure 40 includes the sacrificial gate dielectric layer 42, the sacrificial gate electrode layer 44 (e.g., poly silicon), the pad silicon nitride layer 46 and the silicon oxide mask layer 48. The sacrificial gate structure 40 is formed over a portion of the fin structures which is to be a channel region. The sacrificial gate structure 40 defines the channel region of the GAA FET.

In some embodiments, as shown in FIGS. 7A and 7B (FIG. 7B is an enlarged view of a circled portion in FIG. 7A) a part of the sacrificial gate dielectric layer 42 remains as a residual dielectric layer 42A over the uppermost one of the second semiconductor layer 25. In some embodiments, etching byproduct causes the residual dielectric layer 42A. In some embodiments, the width W1 of the residual dielectric layer 42A is in a range from about 5 nm to about 15 nm and is in a range from about 9 nm to about 12 nm in other embodiments, depending on design and/or process conditions. In some embodiments, as shown in FIG. 7B, the residual dielectric layer 42A has a tapered shape with decreasing thickness as the distance from the sacrificial gate electrode layer 44 increases.

By patterning the sacrificial gate structure, the stacked layers of the first and second semiconductor layers are partially exposed on opposite sides of the sacrificial gate structure, thereby defining source/drain regions, as shown in FIGS. 7A and 7B. In this disclosure, a source and a drain are interchangeably used and the structures thereof are substantially the same. In FIGS. 7A and 7B, two sacrificial gate structures 40 are formed over one fin structure, but the number of the sacrificial gate structures is not limited to two. One or more than two sacrificial gate structures are arranged in the Y direction in some embodiments. In certain embodiments, one or more dummy sacrificial gate structures are formed on both sides of the sacrificial gate structures to improve pattern fidelity.

Figure 8:
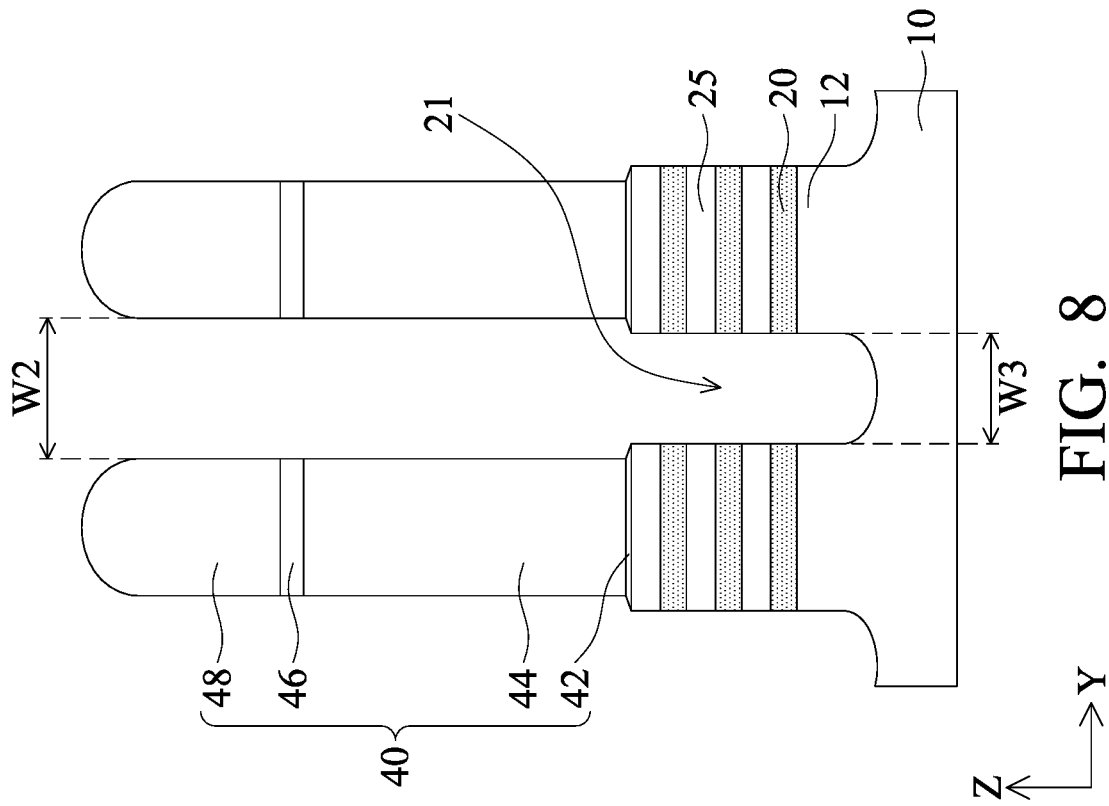
FIG. 8 shows one of the various stages of manufacturing a semiconductor FET device according to an embodiment of the present disclosure.

Then, as shown in FIG. 8, the source/drain regions of the fin structures 29 are recessed (etched). The recess etching is performed without or before forming gate sidewall spacers. The stacked structure of the first semiconductor layers 20 and the second semiconductor layer 25 is etched down at the source/drain region, by using one or more lithography and etching operations, thereby forming a source/drain space 21. In some embodiments, a part of the bottom fin structure 12 is also partially etched in an amount of about 5 nm to about 35 nm. In some embodiments, an n-type FET and a p-type FET are manufactured separately, and in such a case, a region for one type of FET is processed, a region for the other type of FET is covered by a protective layer, such as a silicon nitride layer. As shown in FIG. 8, the uppermost one of the second semiconductor layers 25 has a step laterally protruding from the sacrificial gate electrode layer 44. In some embodiments, a space width W2 between the sacrificial gate electrode layers 44 measured at a level of the interface between the sacrificial gate electrode layer 44 and the sacrificial gate dielectric layer 42 (at the bottom of the sacrificial gate electrode layer 44) is greater than an opening width W3 of the source/drain space 21. In some embodiments, an etching operation for the forming the sacrificial gate structure as shown in FIGS. 7A and 7B (polysilicon etching) and the etching of the source/drain region shown in FIG. 8 are continuously performed without breaking vacuum or under atmospheric pressure, for example, withing a same etching apparatus by changing one or more etching conditions (gas, input power, substrate temperature, pressure, etc.)

Figure 9:
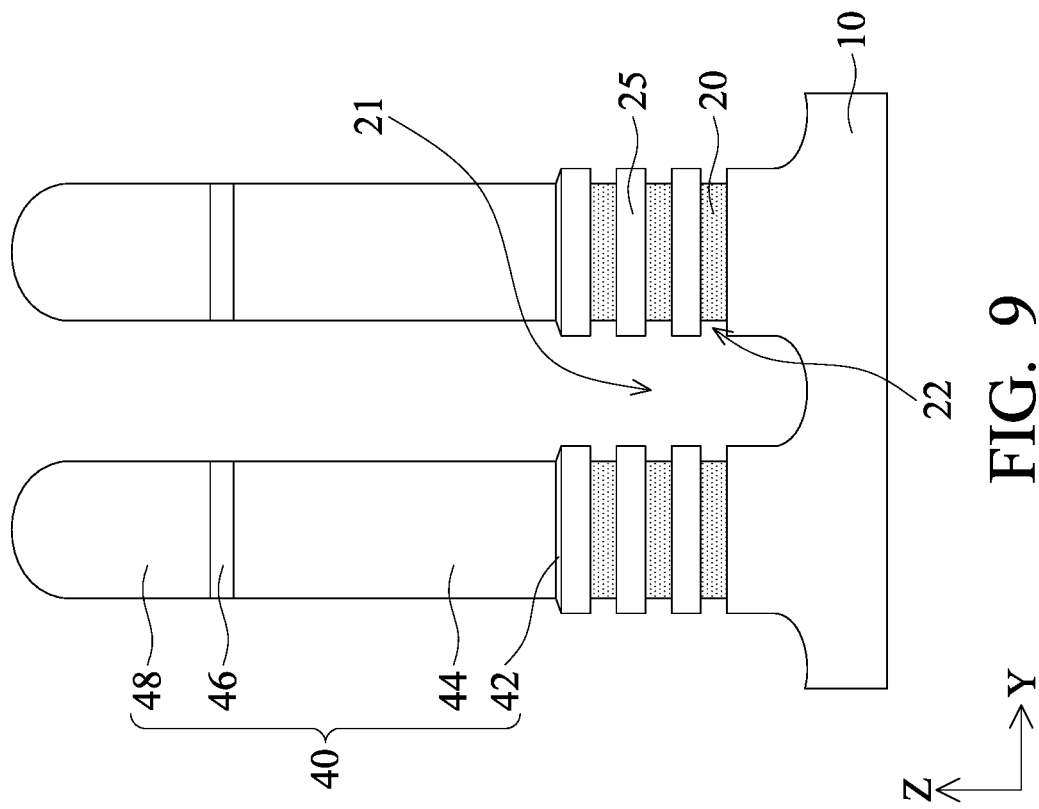
FIG. 9 shows one of the various stages of manufacturing a semiconductor FET device according to an embodiment of the present disclosure.

Further, as shown in FIG. 9, the first semiconductor layers 20 are laterally etched in the Y direction within the source/drain space 21, thereby forming cavities 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments. Other etchants may be used. By using the mixed solution, the ends of the first semiconductor layer 20 have a curved shape. When the first semiconductor layer 20 is made of SiGe having a constant Ge concentration, the wet etching causes more etching at the center portion than the edge portions in the vertical direction due to surface tension and capillary action, and thus the end of the first semiconductor layer has a smiling shape having a deeply etched center region in some embodiments.

Figure 10B:
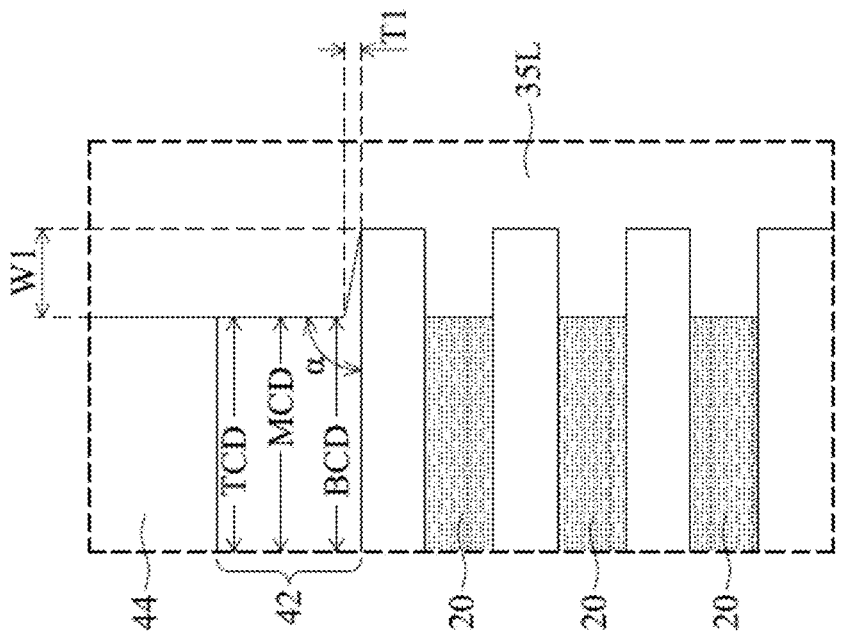
FIGS. 10A and 10B show one of the various stages of manufacturing a semiconductor FET device according to an embodiment of the present disclosure.
Figure 10A:
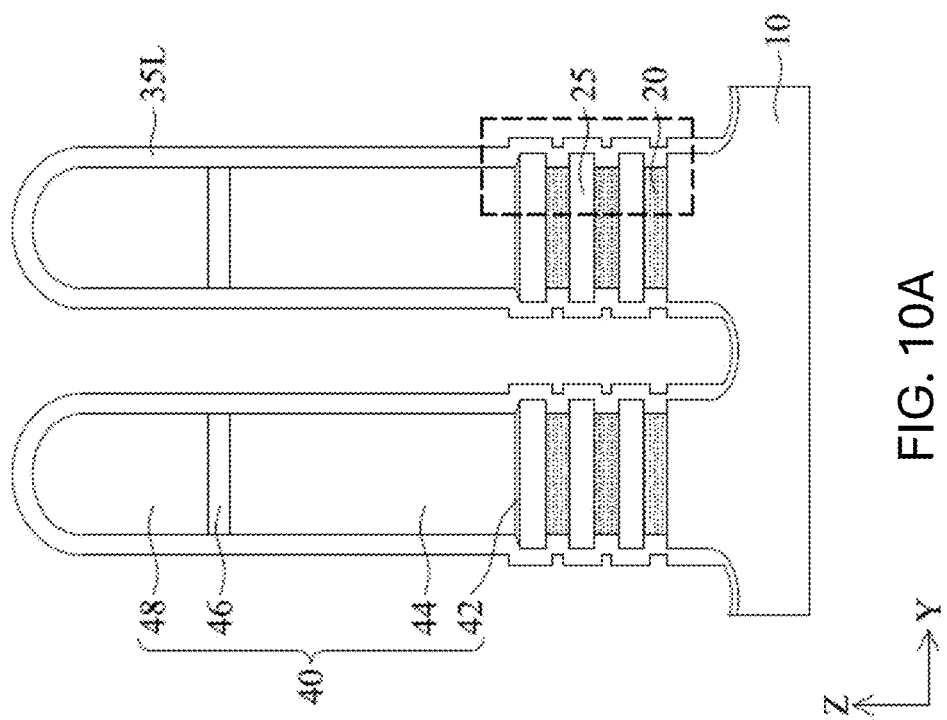

Next, as shown in FIGS. 10A and 10B, a first insulating layer 35L is conformally formed on the etched lateral ends of the first semiconductor layers 20 and on end faces of the second semiconductor layers 25 in the source/drain space 21 and over the sacrificial gate structure 40. The first insulating layer 35L includes one of silicon nitride and silicon oxide, SiON, SiOC, SiCN and SiOCN, or any other suitable dielectric material. The first insulating layer 35L has a thickness in a range from about 1.0 nm to about 10.0 nm. In other embodiments, the first insulating layer 35L has a thickness in a range from about 2.0 nm to about 5.0 nm. The first insulating layer 35L can be formed by ALD, CVD or any other suitable methods. By conformally forming the first insulating layer 45L, the cavities 22 are fully filled with the first insulating layer 35L. In some embodiments, the insulating layer 35L includes two or three layers made of different materials from each other. In some embodiments, one of the insulating layers is formed by oxidation of the ends of the first semiconductor layers 20 and the oxide layer is made of silicon-germanium oxide ($SiGeO_x$). In some embodiments, the thickness of the silicon-germanium oxide is in a range from about 0.1 nm to about 1 nm.

As shown in FIG. 10B, which is an enlarged view of the circled portion of FIG. 10A, the sacrificial gate dielectric layer 42 has a substantially uniform width or a tapered shape, having for example, TCD≥MCD≥BCD. The lateral width W3 of the residual dielectric layer 42A is in a range from about 9 nm to about 12 nm in some embodiments. The largest thickness T1 of the residual dielectric layer 42A under the first insulating layer 35L is in a range from about 0.5 nm to about 2 nm in some embodiments. Further, the angle α of the sidewall of the sacrificial gate dielectric layer 42 is in a range from about 80 degrees to about 90 degrees, and is in a range from about 82 degrees to about 88 degrees in other embodiments.

Figure 11:
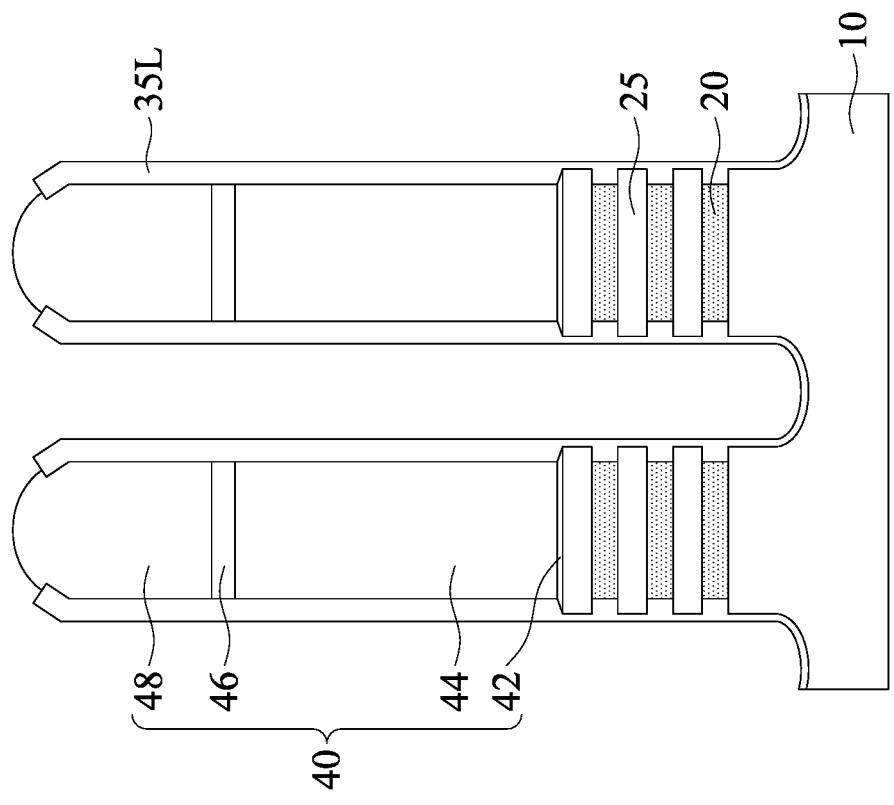
FIG. 11 shows one of the various stages of manufacturing a semiconductor FET device according to an embodiment of the present disclosure.
Figure 12:
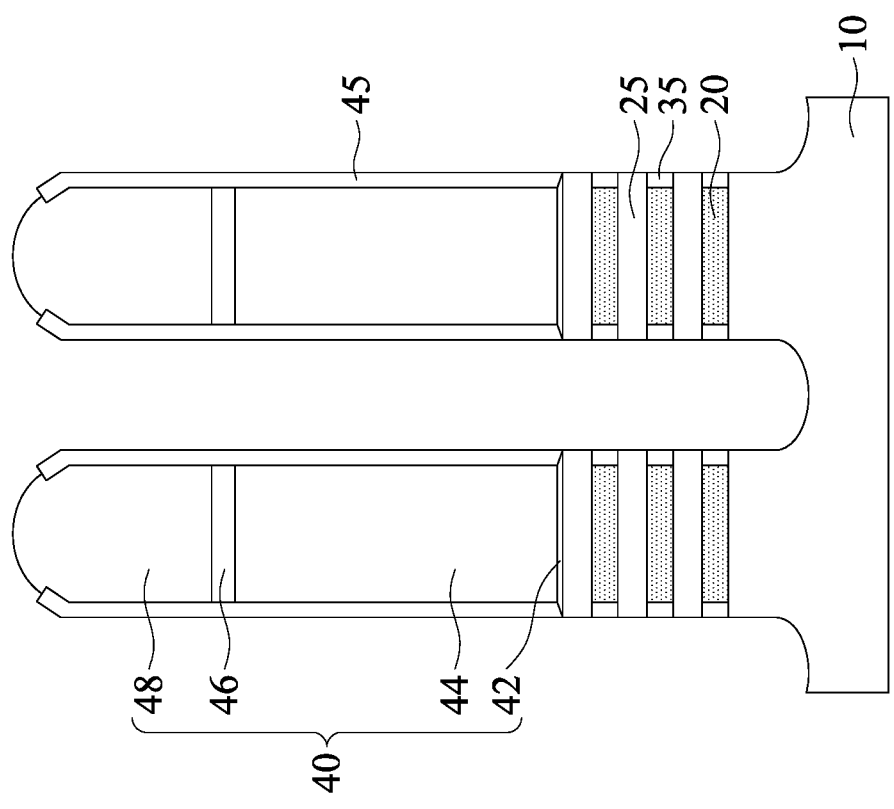
FIG. 12 shows one of the various stages of manufacturing a semiconductor FET device according to an embodiment of the present disclosure.

After the first insulating layer 35L is conformally formed, one or more etching operations are performed to partially remove the first insulating layer 35L, thereby forming inner spacers 35 and gate sidewall spacers 45, which are made of the same material, as shown in FIGS. 11 and 12. In some embodiments, the etching is plasma etching using one or more of HBr, $CH_2F_2$, $CH_3F$, $CF_4$, $O_2$, $N_2$, He and/or Ar. In some embodiments, the outside face of the gate sidewall spacer 45 is flush with the end of the uppermost one of the second semiconductor layers 25. In other embodiments, the outside face of the gate sidewall spacer 45 is located closer to the sacrificial gate electrode layer 44 than the end of the uppermost one of the second semiconductor layers 25.

In some embodiments, the end face of the inner spacers 35 is recessed more than the end face of the second semiconductor layers 25. The recessed amount is in a range from about 0.1 nm to about 2 nm and is in a range from about 0.2 nm to about 1 nm in other embodiments. In other embodiments, the recessed amount is less than 0.5 nm and may be equal to zero (the end face of the inner spacer 35 and the end face of the second semiconductor layers 25 are flush with each other).

In some embodiments, the thickness (horizontal width) of the gate sidewall spacer 45 is the same as or different from the thickness (horizontal width) of the inner spacer 35. In some embodiments, the thickness (horizontal width) of the gate sidewall spacer 45 is in a range from about 3 nm to about 12 nm, and the thickness (horizontal width) of the inner spacer 35 is in a range from about 3 nm to about 12 nm, depending on the design and/or process requirements.

Since the gate sidewall spacer 45 and the inner spacer 35 are made by the same deposition process, the film properties, such as density, internal stress, etching rate against etchant, etc., are the same.

Figure 13:
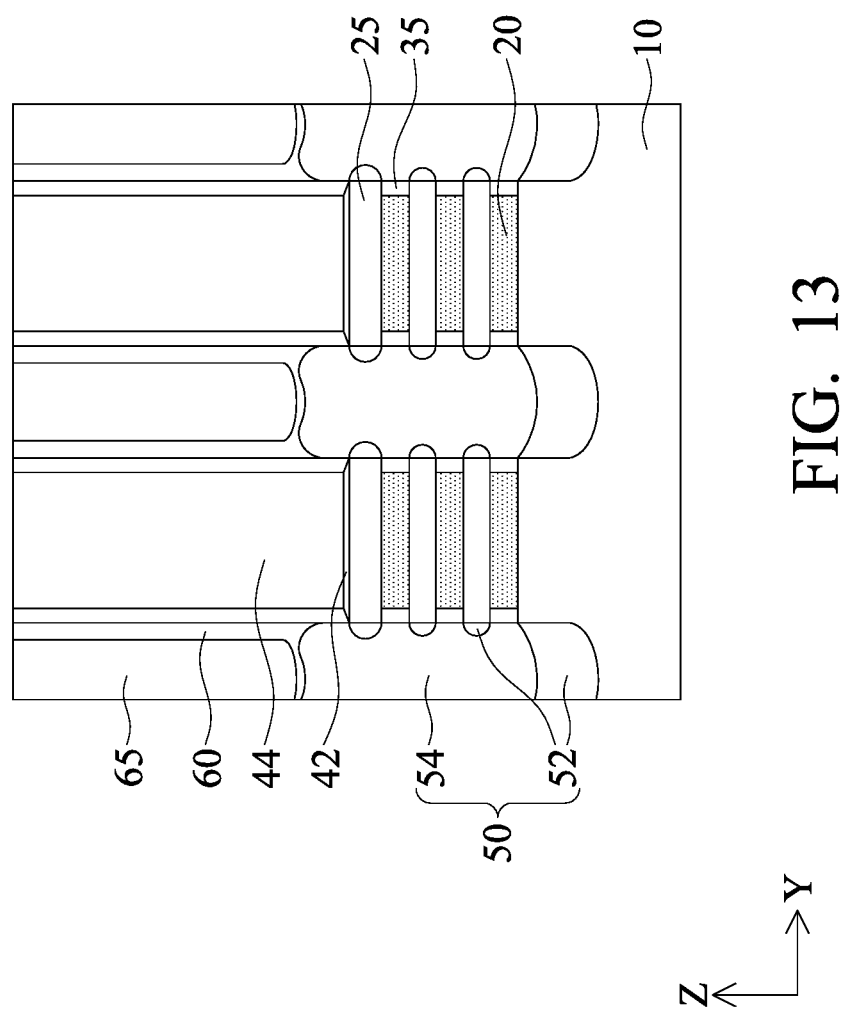
FIG. 13 shows one of the various stages of manufacturing a semiconductor FET device according to an embodiment of the present disclosure.

Subsequently, as shown in FIG. 13, a source/drain epitaxial layer 50 is formed in the source/drain space 21. The source/drain epitaxial layer for the N-type GAA FET includes one or more layers of SiP, SiCP, SiC, SiCAs, SiAs and SiAsP, and the source/drain epitaxial layer for the P-type GAA FET includes one or more layers of Si, SiGe, Ge, SiGeSn or GeSn, and further includes boron (B) and/or carbon (C) in some embodiments.

In some embodiments, the source/drain epitaxial layer 50 includes a first epitaxial layer 52 and a second epitaxial layer 54 having a different P (and/or As) concentration for the n-type FET. In some embodiments, the amount of P (and/or As) is in a range from about $1 \times 10^{20}$ atoms·cm$^{-3}$ to about $1 \times 10^{21}$ atoms·cm$^{-3}$, and is in a range from about $2 \times 10^{20}$ atoms·cm$^{-3}$ to about $6 \times 10^{20}$ atoms·cm$^{-3}$ in other embodiments. In some embodiments, the amount of P (and/or As) in the second epitaxial layer is greater than the amount of P in the first epitaxial layer. The amount of P in the second epitaxial layer is in a range from about $1 \times 10^{21}$ atoms·cm$^{-3}$ to about $5 \times 10^{21}$ atoms·cm$^{-3}$ in some embodiments, and is in a range from about $2 \times 10^{21}$ atoms·cm$^{-3}$ to about $4 \times 10^{21}$ atoms·cm$^{-3}$ in other embodiments.

In other embodiments, the source/drain epitaxial layer 50 includes a first epitaxial layer 52 and a second epitaxial layer 54 having a different Ge (and/or B) concentration for the p-type FET. In some embodiments, a germanium amount of the second epitaxial layer is greater than a germanium amount of the first epitaxial layer. In some embodiments, the Ge amount of the first epitaxial layer is in a range from about 20 atomic % to 40 atomic % and the Ge amount of the second epitaxial layer is in a range from about 35 atomic % to about 50 atomic %. In some embodiments, the SiGe epitaxial layers contain boron as dopant. In some embodiments, a boron concentration of the second epitaxial layer is greater than a boron concentration of the first epitaxial layer.

The amount of B in the second epitaxial layer 64 is in a range from about $1\times10^{20}$ atoms·cm$^{-3}$ to about $5\times10^{20}$ atoms·cm$^{-3}$, and the amount of B in the second epitaxial layer is in a range from about $5\times10^{20}$ atoms·cm$^{-3}$ to about $1\times10^{21}$ atoms·cm$^{-3}$ in other embodiments.

The first source/drain epitaxial layer 52 is in direct contact with the ends of the second semiconductor layers (channel regions) 25, and the recessed bottom fin structure 12. The second epitaxial layer 54 is formed on the first epitaxial layer 52 and on the inner spacer 35. In some embodiments, a bottom of the source/drain epitaxial layer 50 has a rounded shape (e.g., U-shape) or a tapered shape, in which the width of the epitaxial layer decreases toward the substrate. Such a rounded shape can maintain an isolation margin between the source/drain epitaxial layer and the gate structure. The source/drain epitaxial layer 50 is formed by an epitaxial growth method using CVD, ALD or molecular beam epitaxy (MBE).

Then, as shown in FIG. 13, a second insulating layer 60, functioning as an etch stop layer, is formed over the source/drain epitaxial layer 50. The etch stop layer 60 includes one of silicon nitride and silicon oxide, SiON, SiOC, SiCN and SiOCN, or any other suitable dielectric material. The etch stop layer 60 is made of a different material than the sidewall spacers 45 in some embodiments. The etch stop layer 60 can be formed by ALD or any other suitable methods.

Further, as shown in FIG. 13, one or more interlayer dielectric (ILD) layers 65 are formed over the etch stop layer 60. The materials for the ILD layer 65 include compounds comprising Si, O, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 44 is exposed, as shown in FIG. 13.

Then, the sacrificial gate electrode layer 44 and sacrificial gate dielectric layer 42 are removed, thereby forming a gate space, as shown in FIGS. 14A and 14B (FIG. 1B is an enlarged view of the circled portion of FIG. 14A). The ILD layer 65 protects the source/drain epitaxial layer 50 during the removal of the sacrificial gate structures. The sacrificial gate structures can be removed using plasma dry etching and/or wet etching. When the sacrificial gate electrode layer 44 is polysilicon and the ILD layer 65 is silicon oxide, a wet etchant such as a TMAH solution can be used to selectively remove the sacrificial gate electrode layer 44.

The sacrificial gate dielectric layer 42 is thereafter removed using plasma dry etching and/or wet etching. In the case of plasma dry etching, one or more fluorocarbon gases (e.g., CF$_4$, CHF$_3$, etc) are used. In some embodiments, as shown in FIG. 14B, the residual dielectric layer 42A remains after the sacrificial gate dielectric layer 42 is removed. In some embodiments, a part of the residual dielectric layer 42A is slightly laterally etched.

Figure 15:
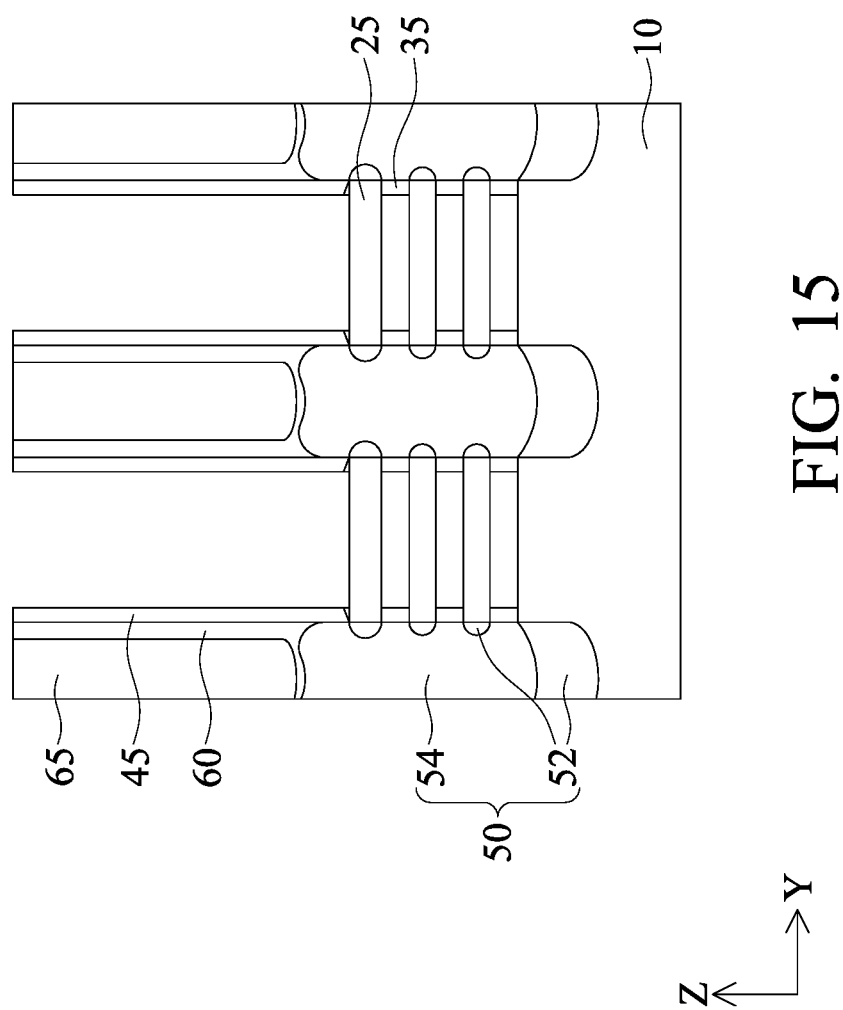
FIG. 15 shows one of the various stages of manufacturing a semiconductor FET device according to an embodiment of the present disclosure.

After the sacrificial gate structures are removed, the first semiconductor layers 20 are removed, thereby forming nanosheets or nanowires (channel regions) of the second semiconductor layers 25, as shown in FIG. 15. The first semiconductor layers 20 can be removed or etched using an etchant that selectively etches the first semiconductor layers 20 against the second semiconductor layers 25, as set forth above. As shown in FIG. 15, since the inner spacers 35 are formed, the etching of the first semiconductor layers 20 stops at the inner spacers 35. In other words, the inner spacers 35 function as an etch-stop layer for etching of the first semiconductor layers 20.

After the semiconductor nanosheets or nanowires (channel regions) of the second semiconductor layers 25 are formed, a gate dielectric layer 102 is formed around each channel regions 25, as shown in FIGS. 16A-16D Further, a gate electrode layer 104 is formed on the gate dielectric layer 102, as shown in FIGS. 16A-16D. FIG. 16B shows a source/drain structure in the X direction cross section. FIGS. 16C and 16D are enlarged views of the circled portion of FIG. 16A.

In some embodiments, an interfacial dielectric layer is formed between the channel regions 25 and the gate dielectric layer 102. In some embodiments, the gate dielectric layer 102 includes one or more layers of a dielectric material, such as silicon oxide, silicon nitride, or a high-k dielectric (e.g., k≥9) material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, tantalum oxide, hafnium dioxide-alumina (HfO$_2$—Al$_2$O$_3$) alloy, other suitable high-k dielectric materials, and/or combinations thereof. In some embodiments, the gate dielectric layer 102 includes one or more elements such as La, Lu, Sc, Sr, Ce, Y, Dy, Eu and Yb. In some embodiments, the thickness of the gate dielectric layer 82 is in a range from about 0.5 nm to about 3 nm, depending on the design and/or process requirements.

In some embodiments, the gate electrode layer 104 includes one or more conductive layers. In some embodiments, the gate electrode layer 104 includes a barrier layer, an adhesion layer, a work function adjustment material (WFM) layer, a glue layer, and/or a body metal layer. In some embodiments, the barrier layer, the adhesion layer and/or the glue layer include TiN, TaN, Ti or Ta. In some embodiments, the WFM layer includes one or more layers. The WFM layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-type GAA FET, one or more of TaN, TaAlC, TiN, TiC, Co, TiAl, HfTi, TiSi and TaSi is used as the WFM layer in the gate electrode 84N, and for the p-type GAA FET, one or more of TiAlC, Al, TiAl, TaN, TaAlC, TiN, TiC and Co is used as the WFM layer in the gate electrode 84P. The body metal layer includes one or more of W, Co, Ni, Mo, Ru or any other suitable materials. In some embodiments, at least one of the WFM layers is continuous between the n-type GAA FET and the p-type GAA FET and at least one of the WFM layer is discontinuous between the n-type GAA FET and the p-type GAA FET. In some embodiments, the body metal layer is continuous between the n-type GAA FET and the p-type GAA FET.

The gate dielectric layer 102 may be formed by CVD, ALD or any suitable method. In one embodiment, the gate dielectric layer 104 is formed using a highly conformal deposition process, such as ALD, to ensure the formation of a gate dielectric layer having a uniform thickness around each channel layers. The thickness of the gate dielectric layer 102 is in a range from about 1 nm to about 6 nm in some embodiments.

The gate electrode layer 104 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

In some embodiments, before the gate electrode layer 104 is formed, the gate sidewall spacers 45 are recessed. In some embodiments, the gate sidewall spacers 45 are recessed before the gate dielectric layer 102 is formed.

In some embodiments, the residual dielectric layer 42A remains at the bottom of the gate sidewall spacer 45 as shown in FIG. 16C. The largest thickness T2 of the residual dielectric layer 42A under the gate sidewall spacer 45 is in a range from about 0.5 nm to about 2 nm in some embodiments. When a part of the residual dielectric layer 42A is etched during the etching of the sacrificial gate dielectric layer 42, the gate dielectric layer 102 penetrates under the gate sidewall spacer as shown in FIG. 16D. Since the residual dielectric layer 42A remains but has a sufficiently thin thickness, it is possible to prevent or suppress a leakage current between the gate electrode 104 and the source/drain epitaxial layer 50.

In some embodiments, after the planarization operation, the gate electrode layer 104 is recessed and a cap insulating layer is formed over the recessed gate electrode 104. The cap insulating layer includes one or more layers of a silicon nitride-based material, such as silicon nitride. The cap insulating layer is formed by depositing an insulating material followed by a planarization operation.

It is understood that the GAA FETs undergo further CMOS processes to form various features such as contacts/vias, interconnect metal layers, dielectric layers, passivation layers, etc.

In the GAA FET device of the present disclosure, it is possible to prevent or suppress a leakage current between the gate electrode and the source/drain epitaxial layer. If the gate sidewall spacers are formed before the source/drain regions are recessed, the thickness (or volume) of the residual dielectric layer 42A under the gate sidewall spacer is greater than the embodiments as explained above. In such a case, during the etching of the sacrificial gate dielectric layer 42, most of the residual dielectric layer 42A is removed, and then the gate dielectric layer 102 penetrates under the gate sidewall spacer, which may cause an increase in a leakage current between the gate electrode and the source/drain epitaxial layer. In contrast, in the present embodiments, since the thickness of the residual dielectric layer 42 is sufficiently small, it is possible to prevent or suppress a leakage current between the gate electrode and the source/drain epitaxial layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure is formed. In the fin structure, first semiconductor layers and second semiconductor layers are alternately stacked over a bottom fin structure protruding from a substrate. A sacrificial gate structure is formed over the fin structure. Without forming an insulating layer on a sidewall of the sacrificial gate structure, a source/drain region of the fin structure, which is not covered by the sacrificial gate structure, is etched, thereby forming a source/drain space. The first semiconductor layers are laterally etched through the source/drain space. A first dielectric layer is formed over the sacrificial gate structure and the inner wall of the source/drain space. A gate sidewall spacer on the sidewall of the sacrificial gate structure and an inner spacer on an end of each of the etched first semiconductor layers are formed by partially etching the first dielectric layer. One or more epitaxial layers are formed in the source/drain space, and the sacrificial gate structure is replaced with a metal gate structure. In one or more of the foregoing and following embodiments, the first insulating layer include one of SiON, SiCN or SiOCN. In one or more of the foregoing and following embodiments, the source/drain space penetrates the bottom fin structure. In one or more of the foregoing and following embodiments, the source/drain space penetrates the bottom fin structure by an amount of 5 nm to 35 nm. In one or more of the foregoing and following embodiments, the sacrificial gate structure includes a sacrificial gate electrode made of amorphous or polycrystalline silicon and a sacrificial gate dielectric layer. In one or more of the foregoing and following embodiments, the sacrificial gate dielectric layer includes aluminum oxide or hafnium oxide. In one or more of the foregoing and following embodiments, an etching operation for the forming the sacrificial gate structure and the etching of the source/drain region are continuously performed without breaking vacuum.

In accordance with another aspect of the present disclosure, in a method of manufacturing a semiconductor device, a fin structure is formed, in which first semiconductor layers and second semiconductor layers are alternately stacked over a bottom fin structure protruding from a substrate, the fin structure extending in a first direction. A pair of sacrificial gate structures are formed over the fin structure. Each of the pair of sacrificial gate structures includes a sacrificial gate electrode made of amorphous or polycrystalline silicon and a sacrificial gate dielectric layer. Without forming an insulating layer on a sidewall of each of the pair of sacrificial gate structures, a source/drain region of the fin structure between the pair of sacrificial gate structures is etched, thereby forming a source/drain space. The first semiconductor layers are laterally etched through the source/drain space. A first dielectric layer is formed over the pair of sacrificial gate structures and the inner wall of the source/drain space. A gate sidewall spacer on the sidewall of each of the pair of sacrificial gate structure and an inner spacer on an end of each of the etched first semiconductor layers are formed by partially etching the first dielectric layer. One or more epitaxial layers are formed in the source/drain space. Each of the pair of sacrificial gate structures is replaced with a metal gate structure. In one or more of the foregoing and following embodiments, an opening width of the source/drain space along the first direction is smaller than a space with between sacrificial gate electrodes of the pair of sacrificial gate structures. In one or more of the foregoing and following embodiments, a part of the sacrificial gate dielectric layer laterally protrudes from the sacrificial gate electrode layer on an upper surface of the fin structure. In one or more of the foregoing and following embodiments, a protruding amount of the part of the sacrificial gate dielectric layer is in a range from 5 nm to 15 nm. In one or more of the foregoing and following embodiments, the part of the sacrificial gate dielectric layer has a tapered shape with decreasing in thickness as increasing in distance from the sacrificial gate electrode layer. In one or more of the foregoing and following embodiments, the sacrificial gate dielectric layer includes aluminum oxide or hafnium oxide. In one or more of the foregoing and following embodiments, the part of the sacrificial gate dielectric layer is disposed between the gate sidewall spacer and the upper surface of the fin structure. In one or more of the foregoing and following embodiments, after the metal gate structure is formed, a portion of the part of the sacrificial gate dielectric layer remains under the gate sidewall spacer. In one or more of the foregoing and following embodiments, the first insulating layer include at least one of SiCN or SiOCN.

In accordance with another aspect of the present disclosure, a semiconductor device includes semiconductor sheets or wires disposed over a bottom fin structure protruding from a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each first channel region and a gate sidewall spacer disposed on a sidewall of the gate electrode layer. A piece of dielectric layer made of a different material than the gate sidewall spacer is disposed at a bottom of the gate sidewall spacer, and a thickness of the piece of dielectric layer laterally varies. In one or more of the foregoing and following embodiments, the thickness of the piece of dielectric layer laterally become thinner toward outside the gate electrode layer. In one or more of the foregoing and following embodiments, the piece of dielectric layer is made of aluminum oxide or hafnium oxide. In one or more of the foregoing and following embodiments, a part of the gate dielectric layer penetrates below the gate sidewall spacer.

In accordance with another aspect of the present disclosure, a semiconductor device includes semiconductor sheets or wires disposed over a bottom fin structure protruding from a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, a gate sidewall spacer disposed on a sidewall of the gate electrode layer, and inner spacers disposed between the source/drain epitaxial layer and portions of the gate electrode layer located between adjacent two of semiconductor sheets or wires. The inner spacers and the gate sidewall spacer are made of a same material having a same film property. In one or more of the foregoing and following embodiments, the film property includes at least one of a density, an internal stress or an etching rate against an etchant.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternately stacked over a bottom fin structure protruding from a substrate;
    forming a sacrificial gate structure over the fin structure;
    without forming an insulating layer on a sidewall of the sacrificial gate structure, etching a source/drain region of the fin structure, which is not covered by the sacrificial gate structure, thereby forming a source/drain space;
    laterally etching the first semiconductor layers through the source/drain space;
    forming a gate sidewall spacer on the sidewall of the sacrificial gate structure and an inner spacer on an end of each of the etched first semiconductor layers;
    forming one or more epitaxial layers in the source/drain space; and
    replacing the sacrificial gate structure with a metal gate structure.

2. The method of claim 1, wherein the gate sidewall spacer and the inner spacer are formed by:
    forming a first dielectric layer over the sacrificial gate structure and an inner wall of the source/drain space; and
    partially etching the first dielectric layer.

3. The method of claim 2, wherein the first dielectric layer includes one of SiON, SiCN or SiOCN.

4. The method of claim 3, wherein the source/drain space penetrates the bottom fin structure by an amount of 5 nm to 35 nm.

5. The method of claim 2, wherein the sacrificial gate structure includes a sacrificial gate electrode made of amorphous or polycrystalline silicon and a sacrificial gate dielectric layer.

6. The method of claim 5, wherein the sacrificial gate dielectric layer includes aluminum oxide or hafnium oxide.

7. The method of claim 2, wherein an etching operation for the forming the sacrificial gate structure and the etching of the source/drain region are continuously performed without breaking vacuum.

8. A method of manufacturing a semiconductor device, comprising:
    forming a fin structure in which first semiconductor layers and second semiconductor layers are alternately stacked over a bottom fin structure protruding from a substrate, the fin structure extending in a first direction;
    forming a pair of sacrificial gate structures over the fin structure, each of the pair of sacrificial gate structures including a sacrificial gate electrode made of amorphous or polycrystalline silicon and a sacrificial gate dielectric layer;
    without forming an insulating layer on a sidewall of each of the pair of sacrificial gate structures, etching a source/drain region of the fin structure between the pair of sacrificial gate structures, thereby forming a source/drain space;
    laterally etching the first semiconductor layers through the source/drain space;
    forming a first dielectric layer over the pair of sacrificial gate structures and an inner wall of the source/drain space;
    forming a gate sidewall spacer on the sidewall of each of the pair of sacrificial gate structures and an inner spacer on an end of each of the etched first semiconductor layers by partially etching the first dielectric layer;
    forming one or more epitaxial layers in the source/drain space; and
    replacing each of the pair of sacrificial gate structures with a metal gate structure.

9. The method of claim 8, wherein an opening width of the source/drain space along the first direction is smaller than a space width between sacrificial gate electrodes of the pair of sacrificial gate structures.

10. The method of claim 9, wherein a part of the sacrificial gate dielectric layer laterally protrudes from the sacrificial gate electrodes on an upper surface of the fin structure.

11. The method of claim 10, wherein a protruding amount of the part of the sacrificial gate dielectric layer is in a range from 5 nm to 15 nm.

12. The method of claim 10, wherein the part of the sacrificial gate dielectric layer has a tapered shape with decreasing thickness as a distance from the sacrificial gate electrodes increases.

13. The method of claim 10, wherein the sacrificial gate dielectric layer includes aluminum oxide or hafnium oxide.

14. The method of claim 10, wherein the part of the sacrificial gate dielectric layer is disposed between the gate sidewall spacer and the upper surface of the fin structure.

15. The method of claim 10, wherein after the metal gate structure is formed, a portion of the part of the sacrificial gate dielectric layer remains under the gate sidewall spacer.

16. The method of claim 8, wherein the first dielectric layer includes at least one of SiCN or SiOCN.

17. A method of manufacturing a semiconductor device, comprising:

depositing semiconductor sheets or wires over a bottom fin structure protruding from a substrate;

depositing a source/drain epitaxial layer in contact with the semiconductor wires or sheets;

disposing a gate dielectric layer on and wrapping around each channel region of the semiconductor wires or sheets;

disposing a gate electrode layer on the gate dielectric layer and wrapping around each channel region of the semiconductor wires or sheets; and disposing a gate sidewall spacer on a sidewall of the gate electrode layer, wherein a piece of dielectric layer made of a different material than the gate sidewall spacer is disposed at a bottom of the gate sidewall spacer, and a thickness of the piece of dielectric layer laterally varies.

18. The method of claim 17, wherein the thickness of the piece of dielectric layer becomes thinner as a distance from the gate electrode layer increases.

19. The method of claim 17, wherein the piece of dielectric layer is made of aluminum oxide or hafnium oxide.

20. The method of claim 17, wherein a part of the gate dielectric layer penetrates below the gate sidewall spacer.

* * * * *